United States Patent
Burger et al.

(10) Patent No.: US 10,937,825 B2
(45) Date of Patent: Mar. 2, 2021

(54) METHOD OF PRODUCING AN OPTOELECTRONIC DEVICE WITH A FRAME PROJECTING WITH CIRCULAR RECEPTACLE SECTION BEYOND A FIRST SIDE OF A LENS

(71) Applicant: OSRAM Opto Semiconductors GmbH, Regensburg (DE)

(72) Inventors: Markus Burger, Laaber (DE); Markus Pindl, Tegernheim (DE); Markus Boss, Regensburg (DE)

(73) Assignee: OSRAM OLED GmbH, Regensburg (DE)

( * ) Notice: Subject to any disclaimer, the term of this patent is extended or adjusted under 35 U.S.C. 154(b) by 0 days.

(21) Appl. No.: 15/959,425

(22) Filed: Apr. 23, 2018

(65) Prior Publication Data
US 2018/0308894 A1   Oct. 25, 2018

(30) Foreign Application Priority Data
Apr. 24, 2017   (DE) .................... 10 2017 108 688.9

(51) Int. Cl.
*H01L 27/146*   (2006.01)
*G02B 3/08*   (2006.01)
(Continued)

(52) U.S. Cl.
CPC .......... *H01L 27/14685* (2013.01); *G02B 3/08* (2013.01); *G02B 6/4206* (2013.01);
(Continued)

(58) Field of Classification Search
CPC ........................... H01L 27/14685; G02B 3/08
See application file for complete search history.

(56) References Cited

U.S. PATENT DOCUMENTS

2002/0113244 A1*   8/2002   Barnett .................. F21V 29/70
257/98
2006/0114678 A1*   6/2006   Shimonishi .............. G02B 3/14
362/296.02
(Continued)

FOREIGN PATENT DOCUMENTS

DE   60 2004 011 659 T2   1/2009
EP   2 302 295 A1   3/2011
WO   2014/048682 A1   4/2014

OTHER PUBLICATIONS

First Office Action dated Jun. 3, 2020, of counterpart Chinese Application No. 201810366042.5, along with an English translation.

*Primary Examiner* — Thao X Le
*Assistant Examiner* — Xia L Cross
(74) *Attorney, Agent, or Firm* — DLA Piper LLP (US)

(57) ABSTRACT

A method of producing an optoelectronic device includes providing an optical element including an optical lens and including a frame, wherein the frame projects with a receptacle section beyond a first side of the lens, the receptacle section of the frame surrounds a receptacle space, and the receptacle section of the frame includes a bearing face at an inner side; inserting an optoelectronic component and a transparent intermediate element into the receptacle space; placing the intermediate element onto the bearing face; and securing the component and the intermediate element to the frame.

8 Claims, 7 Drawing Sheets

(51) Int. Cl.
*G02B 6/42* (2006.01)
*G02B 6/43* (2006.01)
*G02B 7/02* (2021.01)

(52) U.S. Cl.
CPC ............... *G02B 6/43* (2013.01); *G02B 7/025* (2013.01); *H01L 27/14627* (2013.01)

(56) References Cited

U.S. PATENT DOCUMENTS

2009/0212306 A1* 8/2009 Bogner ............... H01L 31/0203
    257/98
2011/0254450 A1* 10/2011 Bergholz ............... G08G 1/095
    315/121
2018/0306405 A1* 10/2018 Kong ........................ F21V 5/04

* cited by examiner

METHOD OF PRODUCING AN OPTOELECTRONIC DEVICE WITH A FRAME PROJECTING WITH CIRCULAR RECEPTACLE SECTION BEYOND A FIRST SIDE OF A LENS

TECHNICAL FIELD

This disclosure relates to a method of producing an optoelectronic device and to an optoelectronic device.

BACKGROUND

It is known to form optoelectronic devices comprising a lens, comprising an optoelectronic component and comprising a housing. There is nonetheless a need to provide an improved method of producing an optoelectronic device and an improved optoelectronic device.

SUMMARY

We provide a method of producing an optoelectronic device including providing an optical element including an optical lens and including a frame, wherein the frame projects with a receptacle section beyond a first side of the lens, the receptacle section of the frame surrounds a receptacle space, and the receptacle section of the frame includes a bearing face at an inner side; inserting an optoelectronic component and a transparent intermediate element into the receptacle space; placing the intermediate element onto the bearing face; and securing the component and the intermediate element to the frame.

We also provide an optoelectronic device including an optical lens including a frame, wherein the frame projects with a receptacle section beyond a first side of the lens, the receptacle section of the frame surrounds a receptacle space, and the receptacle section of the frame includes a bearing face at an inner side; a transparent intermediate element arranged in the receptacle space and arranged on the bearing face; and an optoelectronic component arranged in the receptacle space and arranged on the intermediate element, and the component and the intermediate element are secured to the frame.

Figure 1:
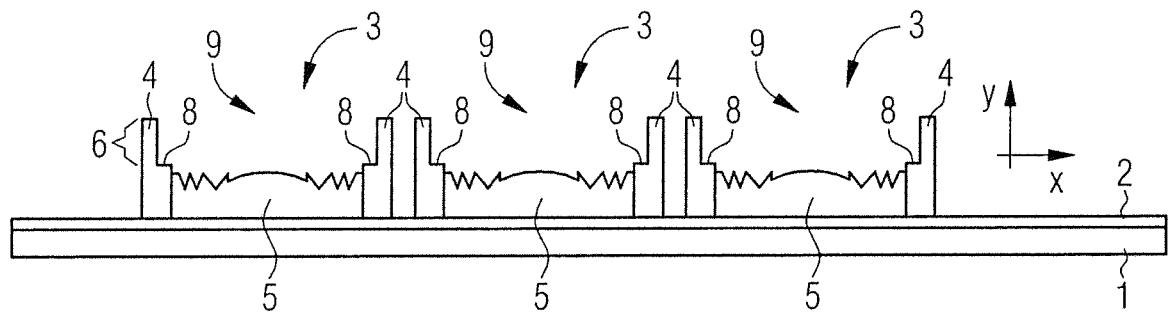
FIG. 1 shows a schematic cross section through a carrier with a plurality of optical elements comprising lenses and frames.

LIST OF REFERENCE SIGNS 1 carrier
2 adherent layer
3 optical element
4 frame
5 lens
6 receptacle section
7 first side of lens
8 bearing face
9 receptacle space
10 web
11 intermediate element
12 free space
13 optoelectronic component
14 side face of optoelectronic component
15 inner wall of frame
16 interspace
17 first electrical terminal
18 second electrical terminal
19 connection layer
20 further connection layer
21 connection material
22 second intermediate element
23 unit
24 sheath
25 connection web

DETAILED DESCRIPTION

One advantage of our method is that a lens may be mounted onto an optoelectronic component by a simple process sequence. Moreover, an optoelectronic device comprising lens and component comprising small dimensions may be obtained. Furthermore, a device that is mechanically stable in conjunction with small dimensions may be produced. Furthermore, the device may comprise a component formed without a carrier.

To achieve these advantages, a method of producing an optoelectronic device is proposed, wherein an optical element comprising an optical lens and a frame is provided. The frame surrounds the lens. The frame projects with a receptacle section beyond a first side of the lens. The receptacle section of the frame surrounds a receptacle space. The receptacle space of the frame comprises a bearing face at an inner side. The bearing face may be formed in a manner extending at least in sections or ring-shapedly completely around the inner side of the frame. A transparent intermediate element is placed on the bearing face. An optoelectronic component is inserted into the bearing face and placed onto the intermediate element. Afterward, the component is secured to the frame. As a result of this method, it is not necessary for the component to comprise a high mechanical strength. Consequently, the component may be formed, for example, without a carrier and substantially only with semiconductor layers, in particular with epitaxially deposited semiconductor layers. Stability for the component is realized with the aid of the intermediate element and with the aid of the frame. Even with the use of a component comprising a carrier, the carrier may be formed in a thin fashion.

The optoelectronic component may be formed, for example, in the form of a radiation-emitting component, in particular in the form of a light-emitting diode or a laser diode. Moreover, the optoelectronic component may also be formed in the form of a photodiode or in the form of a light-sensitive sensor. Moreover, the device may be produced by simple steps.

The intermediate element may comprise a conversion material. Moreover, the intermediate element may be formed as a conversion element comprising conversion material. By way of example, the intermediate element may be formed in the form of a transparent plate comprising glass or sapphire, for example. Moreover, the intermediate element may be formed as a conversion element in the form of a plate. The conversion material and the conversion element are configured to shift the wavelength of at least part of the electromagnetic radiation emanating from the optoelectronic component.

The conversion element may be formed separately with respect to the intermediate element and arranged between the lens and the component. A desired shift in the wavelength of the electromagnetic radiation may be achieved in this way. Moreover, increased stability of the device is achieved by formation of the conversion element. Furthermore, by virtue of the separate formation of the conversion element, formation of the conversion element is possible independently of formation of the intermediate element. Consequently, the intermediate element may be optimized with regard to mechanical properties.

The intermediate element may be secured to the frame via a connection element. By way of example, the connection element is formed from an adhesive material, e.g., in the form of an adhesive layer. The connection material may connect the intermediate element either to the bearing face and/or laterally to the frame. What may be achieved as a result is that the intermediate element is secured to the frame reliably and securely. The mechanical stability of the device is increased as a result of the additional connection of the intermediate element to the frame.

An interspace may be formed between the component and the receptacle section of the frame. Connection material is at least partly filled into the interspace. The connection material forms a connection layer and secures the component to the frame. In this way it is possible for the component to be secured to the frame stably and securely. Furthermore, with the aid of the connection material, the interspace may be completely filled and a sealing may thus be achieved. In particular, a layer comprising connection material may be introduced between a side face of the component and the frame. As a result, besides the connection of the component to the frame, side faces of the component may be protected vis-à-vis environmental influences.

The intermediate element and/or the conversion element constitute a type of support, carrier or substrate for the component that assist the mechanical stability of the component.

The bearing region of the frame and/or the second bearing region of the intermediate element, which bears on the frame, may be formed as sealing surfaces. In this way, it is possible to prevent liquid connection material from flowing in onto the first side of the lens.

The first side of the lens may be arranged at a distance relative to the bearing region of the frame such that the first side of the lens is arranged at a distance from the intermediate element. An air gap may thus be provided between the intermediate element and the lens. This is advantageous in particular in formation of an LED module comprising a lens if the LED module is formed as a flash module, for example, comprising a Fresnel lens or in the form of a backlight module comprising a TIR lens.

A second side of the lens arranged opposite to the first side of the lens may terminate flush with the frame. As a result, a compact construction of the device is achieved, which moreover is formed in a manner insensitive to dirt.

The connection material may be formed as adhesive material or as mold material.

The optoelectronic component may be formed, for example, in the form of a flip-chip, wherein electrical contacts of the component are arranged on an underside and thus opposite the intermediate element. The intermediate element and/or the conversion element comprise a stiff mechanical stability such that the intermediate element and/or the conversion element are/is suitable as a carrier and/or as stabilization for the optoelectronic component. By way of example, the conversion element may be formed as ceramic. The transparent intermediate element may be formed as a glass lamina, for example. The intermediate element may also be formed from some other transparent and stable material.

The optoelectronic device proposed comprises the advantage that it comprises small dimensions and is formed in a mechanically stable manner. In particular, the device may comprise an optoelectronic component without a carrier substrate. In this case, the optoelectronic component may be formed in particular from semiconductor layers, in particular epitaxially deposited semiconductor layers. The optoelectronic component may be formed in the form of a semiconductor layer sequence comprising an active zone.

The semiconductor layer sequence may also be arranged on a carrier substrate such as sapphire, for example. However, the carrier substrate may be dispensed with. This is possible since the semiconductor layer structure is arranged on the intermediate element. By way of example, a compact LED module comprising a lens may thus be provided. By way of example, the LED module may be formed as a flash module comprising a Fresnel lens or as a backlight module comprising a TIR lens.

The optoelectronic device comprises the optoelectronic component and an optical lens comprising a frame. The frame surrounds the lens. The frame projects with a receptacle section beyond a first side of the lens. The receptacle section of the frame surrounds the receptacle space. A bearing face is formed on an inner side of the receptacle section. The component is arranged in the receptacle space. A transparent intermediate element is arranged between the lens and the component. The intermediate element is arranged on the bearing face of the frame. An interspace is formed between the component and the receptacle section of the frame. A connection material is arranged in the interspace. The connection material connects the component to the frame. The connection material may fill the interspace around the component at least in sections. Stable mechanical securing of the component to the frame is achieved as a result. Moreover, the region between the intermediate element and the lens may be sealed with the aid of the connection material.

Furthermore, side faces of the component may be covered with the aid of the connection material and thereby protected against environmental influences. In one simple example, the component is formed in the form of a semiconductor layer sequence comprising semiconductor materials.

The intermediate element may be formed as a mechanically stable plate. The intermediate element may consist of glass or sapphire, for example. Moreover, the intermediate element may comprise conversion material. Furthermore, the intermediate element itself may be formed as a conversion element, for example, in the form of a plate. A stable mounting of the component in the device is made possible with the aid of the intermediate element. Therefore, it is not necessary for the component itself to comprise a sufficiently high mechanical stability.

Consequently, the component may comprise a small thickness. Between the lens and the component a conversion element may be arranged in the frame. Consequently, in addition to the intermediate element a separate conversion element may be provided in the frame. The conversion element may be formed in the form of an in particular stable mechanical plate, in particular in the form of a ceramic plate. The conversion element may be arranged on the intermediate element and arranged between the intermediate element and the component. A simple construction and a simple mounting of the conversion element are made possible in this way. In this example, it is not necessary for the conversion element itself to be secured to the frame or the intermediate element via a connection material.

The component may connect to the intermediate element via a connection layer. In this example, introduction of connection material into the interspace between the component and the frame may be dispensed with.

The component may be formed integrally with the intermediate element, for example, in the form of a Chip Scale Package (CSP). The component together with the intermediate element bears on the bearing face and connects to the frame. Consequently, even with a preassembled intermediate element with component, a compact device may be realized in this way. The bearing face serves for a precise positioning of the intermediate element with component. In particular, the distance between the lens and the intermediate element and the component may be defined precisely by the bearing face.

The side faces of the component may be secured to the frame via a connection layer. The component is thus secured to the frame securely and robustly. Moreover, side faces of the component may be covered with the aid of the connection layer and protected vis-à-vis environmental influences.

The connection material may be formed, for example, in the form of a potting material comprising scattering particles or reflective particles. Consequently, the component may be covered with a scattering layer at the side faces.

The connection material may be arranged between the component and the frame in a manner distributed around the component at least in sections. The connection material may also be arranged in a manner extending ring-shapedly around the component in the interspace between the component and the frame. A secure and stable fixing of the component in the frame is achieved as a result.

The intermediate element may comprise conversion material or be formed as a conversion element. Moreover, between the lens and the component a separate conversion element may be arranged in the frame. By way of example, the conversion element is arranged between the intermediate element and the component. However, the intermediate element may also itself be formed as a stable plate-shaped element and bear on the bearing face. Moreover, the conversion element may also be preassembled with the component and be secured as one part in the frame.

A plurality of lenses with frames may be arranged in a composite assemblage.

The above-described properties, features and advantages and the way in which they are achieved will become clearer and more clearly understood in association with the following description of examples explained in greater detail in association with the drawings.

FIG. 1 shows a carrier 1 comprising, for example, an adherent layer 2, e.g., in the form of a film or an adhesive layer. The adherent layer 2 may also be dispensed with. Optical elements 3 are arranged on the carrier. An optical element 3 comprises a frame 4 and a lens 5. The frame 4 surrounds the lens 5 at least in sections, in particular ring-shapedly. The adherent layer 2 comprises the advantage that the optical element 3 may be secured to the carrier 1 in a simple manner. Moreover, in a later method step, the optical element 3 may be released from the carrier 1 more simply.

The frame 4 projects with a receptacle section 6 beyond a first side 7 of the lens 5. A bearing face 8 is formed circumferentially around the lens 5 on an inner side of the frame 4. The bearing face 8 is formed as an incision into the inner side of the frame 4. Consequently, the frame 4 comprises a larger internal diameter above the bearing face 8 than below the bearing face 8, that is to say in the region of the lens 5. In the example illustrated, the bearing face 8 is formed perpendicular to a longitudinal extent of the frame 4. The frame 4 extends along a y-axis. The bearing face 8 is aligned perpendicular to the y-axis. The bearing face 8 and the frame 4 are formed ring-shapedly circumferentially around the lens 5. The receptacle section 6 of the frame 4 delimits a receptacle space 9 above the lens 5.

The bearing face 8 may also be formed at different angles with respect to the y-axis. Moreover, the bearing face 8 may also be formed in the form of a web projecting laterally inward beyond the frame 4. Consequently, the frame 4 may comprise a cross section of the same size as in the region of the lens 5 in the receptacle space 9 as well. Moreover, the interior of the frame 4 may be formed such that in the region of the lens 5 it is larger or smaller than in the region of the receptacle space 9. The lens 5 may be formed in various forms and may be formed, for example, as a Fresnel lens or as a TIR lens.

Figure 2:
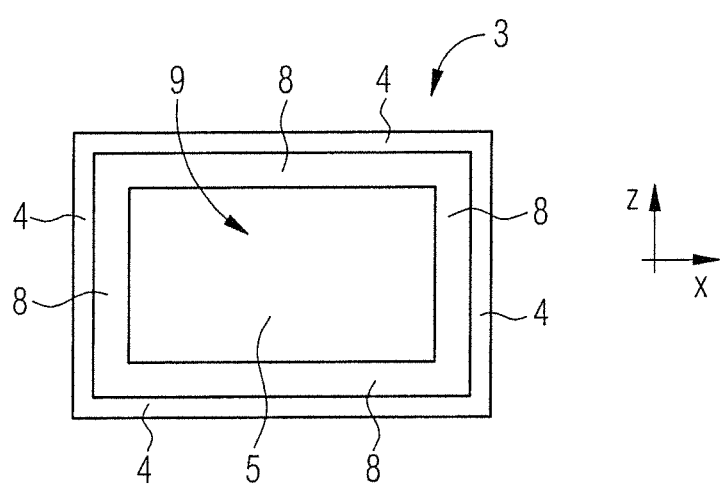
FIG. 2 shows a schematic plan view of an optical element comprising lens and frame.

FIG. 2 shows a schematic plan view of an optical element 3 from above looking at the bearing face 8. The bearing face 8 is formed circumferentially around the lens 5. In the example illustrated, the lens 5 comprises a rectangular cross section. The bearing face 8 is formed in the form of a strip around the lens 5. The outer contour of the lens 5 may also comprise other shapes and comprise in particular a round outer contour. In an analogous manner, the bearing face 8 may be formed, for example, as a strip-shaped ring face surrounding the lens 5. Moreover, the bearing face 8 may comprise a rectangular outer contour and a circular inner contour nestling against the circular outer contour of the lens.

Figure 3:
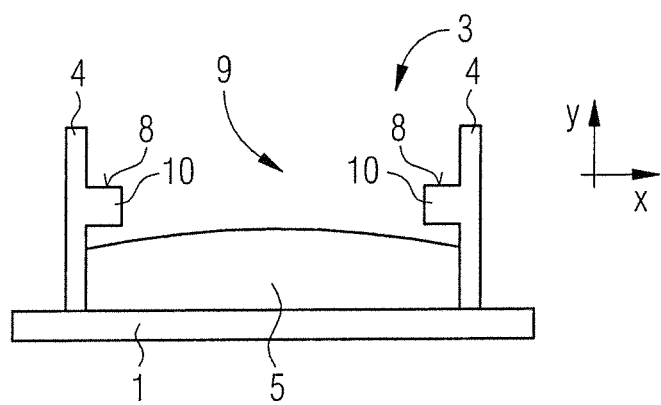
FIG. 3 shows a schematic cross section through a carrier with a further example of an optical element comprising lens and frame.

FIG. 3 shows, in a schematic cross section, a further example of an optical element 3, wherein the bearing face 8 is formed in the form of a web 10 formed circumferentially around an inner side of the frame 4. A top side of the web 10, the top side being arranged opposite to the lens 5, forms the bearing face 8.

In the examples in FIGS. 1 and 3, the bearing face 8 may comprise a constant width or a variable width or be configured continuously in the form of a strip ring-shapedly around the lens 5 or with interruptions in the form of sections. Furthermore, the bearing face 8 may be formed only in sections. Consequently, a bearing face 8 may comprise, for example, only two or three partial faces arranged at a distance from one another and in a manner distributed around the lens 5.

Figure 4:
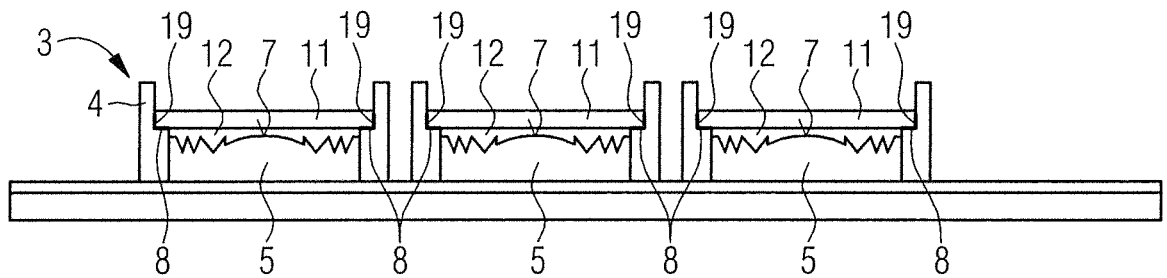
FIG. 4 shows a second method step, wherein an intermediate element is inserted into the optical element.

FIGS. 4 to 9 show various method steps of producing an optoelectronic device. FIG. 4 illustrates the arrangement from FIG. 1, wherein a transparent intermediate element 11 is inserted into the receptacle space 9 of the optical element 3. The intermediate element 11 consists of a mechanically stable material which is formed in a plate-shaped fashion and comprises a predefined carrying capacity. The carrying capacity is of a magnitude such that an optoelectronic component may be carried. The intermediate element 11 is placed onto the bearing face 8 of the frame 4. The intermediate element 11 is transparent to an electromagnetic radiation in particular from an optoelectronic component. The intermediate element 11 may consist of plastic, glass, sapphire, ceramic or similar materials. The intermediate element 11 bears by outer edge regions on the bearing face 8. The lens 5 and the bearing face 8 are formed such that a first side 7 of the lens 5 comprises a distance with respect to the intermediate element 11. The intermediate element 11 may comprise conversion material. The conversion material may comprise Ce:YAG, e.g., as phosphor or luminophore. Moreover, the conversion material may comprise as host material at least one substance from the group comprising oxides, nitrides, oxynitrides, sulfides, oxysulfides, halides, halooxides, halosulfides, tellurides and selenides, wherein the host material is doped at least with a substance from the group containing rare earths (Ce, Eu, Tb, Gd, . . . ), transition metals (Cr, Mn) and/or heavy metals (Tl, Pb, Bi). Moreover, the intermediate element 11 itself may be formed as a conversion element. To that end, the intermediate element 11 is formed as a conversion element, for example, in the form of a lamina comprising luminophore, in particular in the form of a ceramic lamina comprising a luminophore. Moreover, the intermediate element 11 may comprise a layer comprising conversion material. In the case, too, of formation of the intermediate element 11 in the form of a conversion element, in particular a conversion lamina, the intermediate element 11 comprises a sufficient mechanical stability to carry an optoelectronic component. A connection layer 19, for example, in the form of an adhesive layer may be provided between the bearing face 8 and the intermediate element 11 and/or between side faces of the intermediate element 11 and the frame 4. The connection layer 19 may also be dispensed with and the intermediate element 11 may bear only on the bearing face 8.

Figure 5:
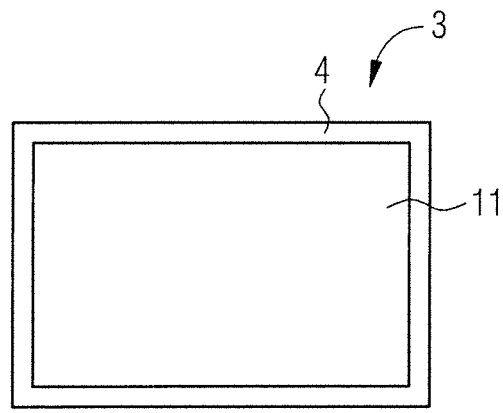
FIG. 5 shows a schematic plan view of an optical element from FIG. 4.

FIG. 5 shows, in a schematic illustration, a plan view from above of the optical element 3 from FIG. 4 with the intermediate element 11.

Figure 6:
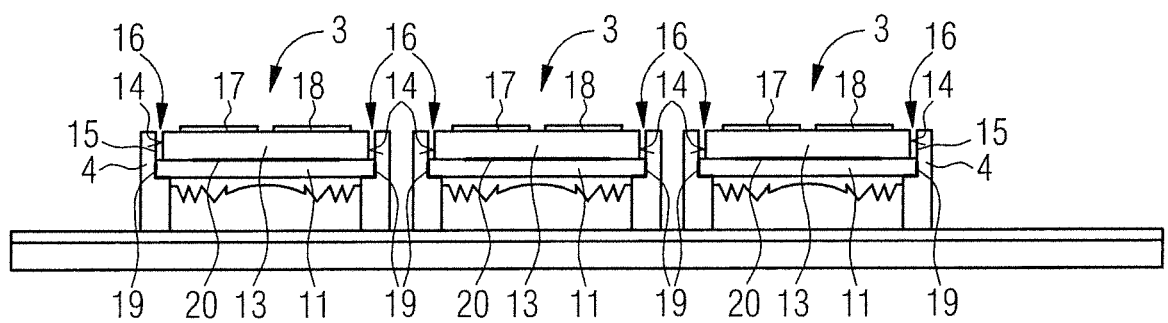
FIG. 6 shows a schematic cross section through optical elements in which optoelectronic components are inserted into the frames.

FIG. 6 shows a further method step, wherein an optoelectronic component 13 is placed onto the intermediate element 11 and is situated in the receptacle space 9. An interspace 16 is formed between side faces 14 of the optoelectronic component 13 and an inner wall 15 of the frame 4. The optoelectronic component 13 comprises electrical terminals 17, 18 on a top side arranged opposite to the intermediate element 11. The optoelectronic component 13 may be formed, for example, as a radiation-emitting component, in particular as a light-emitting diode or as a laser diode. Moreover, the optoelectronic component 13 may also be formed as a light-sensitive sensor, in particular as a photodiode. The optoelectronic component may be formed, for example, without a carrier in the form of semiconductor layers. In the example as a radiation-emitting component, the semiconductor layers may comprise an active zone. The active zone may be produced by an interface between a positively doped semiconductor layer and a negatively doped semiconductor layer. Moreover, in the formation of the optoelectronic component 13 in the form of a photodiode, it is possible to produce a light-sensitive boundary layer between a positively doped semiconductor layer and a negatively doped semiconductor layer. As a result of the carrying capacity of the intermediate element 11, the optoelectronic component may be formed in a very thin fashion and with low self-carrying properties. Consequently, by way of example, in the formation of the optoelectronic component in the form of a light-emitting diode, a carrier substrate comprising sapphire, for example, may be dispensed with. Consequently, a substrateless optoelectronic component may be inserted and mounted into the optical element.

A further connection layer 20, e.g., comprising a transparent connection material, in particular comprising a transparent adhesive, may be formed between the intermediate element 11 and the optoelectronic component 13. The further connection layer 20 may be formed over the whole area between the intermediate element 11 and the optoelectronic component 13 or may be formed only in sections or at points. Consequently, mechanical securing of the intermediate element 11 and the optoelectronic component 13 to the frame 4 may already be achieved with the aid of the connection layer 19 and the further connection layer 20.

Figure 7:
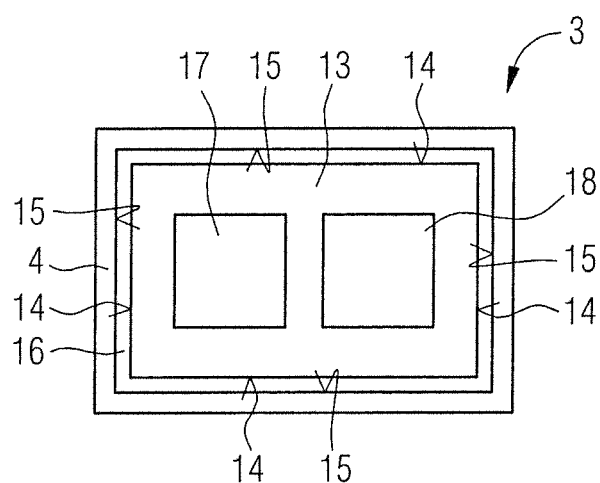
FIG. 7 shows a schematic plan view of an optical element with inserted optoelectronic component.

FIG. 7 shows a schematic plan view from above of an arrangement from FIG. 6. The interspace 16 between the inner wall 15 of the frame 4 and the side faces 14 of the optoelectronic component 13 is clearly discernible in this illustration. The interspace 16 is formed circumferentially around the optoelectronic component 13.

Figure 8:
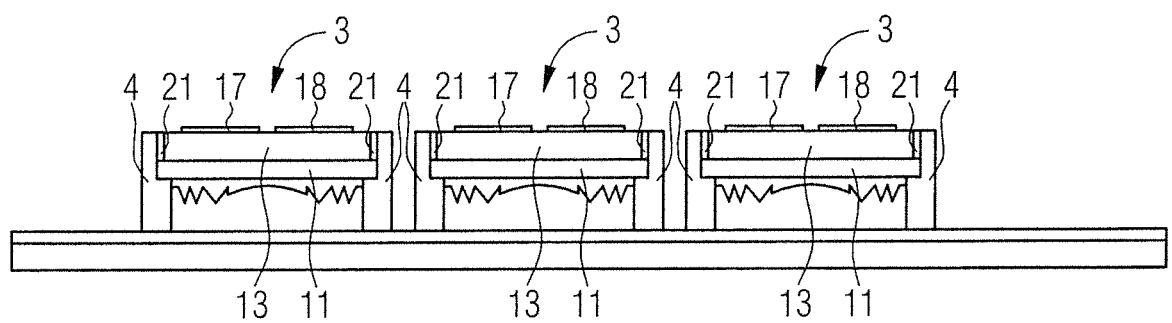
FIG. 8 shows a schematic cross section through optical elements with optoelectronic components that are secured to the frame with the aid of a connection material.

It is possible, as illustrated in FIG. 8, for connection material 21 to be filled into the interspace 16. The connection material 21 may be formed, for example, as adhesive material or as mold material. Moreover, the connection material 21 may comprise scattering or reflective particles. By way of example, silicone, epoxy or plastic may be used as mold material. By way of example, silicone-based adhesive materials may be used as adhesive material. Upon introducing the connection material 21 into the interspace 16, it is also possible to dispense with the connection layer 19 and/or the further connection layer 20, as illustrated schematically in FIG. 8. The connection material 21 may fill the entire interspace 16 or only sections or parts of the interspace 16.

Figure 9:
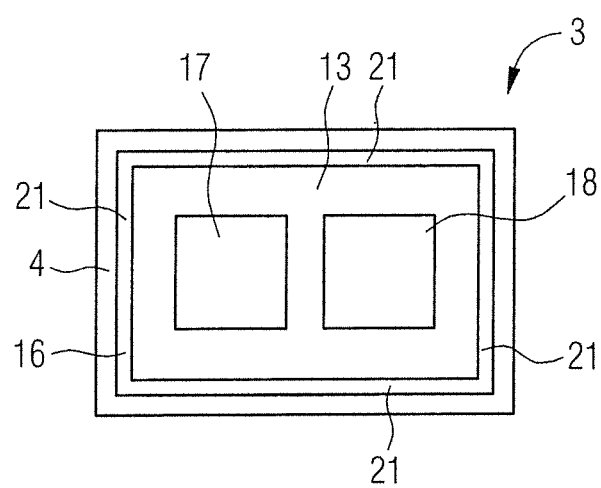
FIG. 9 shows a schematic plan view of an optical element from FIG. 8.

FIG. 9 shows a schematic plan view of one example of the arrangement from FIG. 8.

Figure 10:
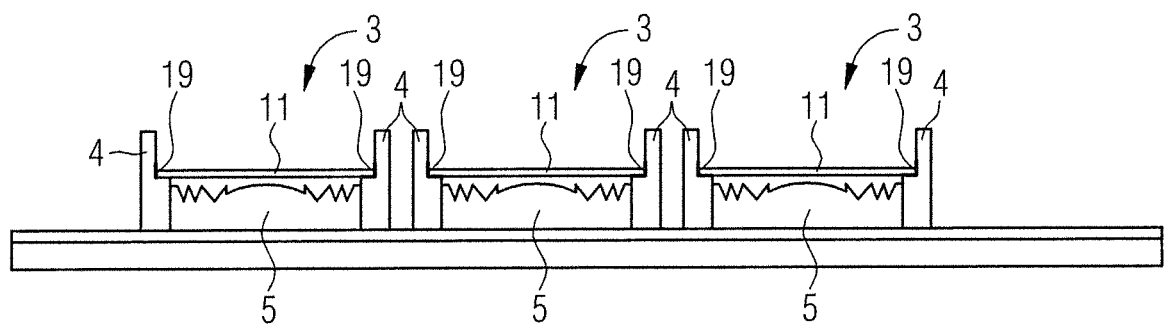
FIGS. 10 to 13 show a further method of producing a device.

FIGS. 10 to 14 show a further method of producing a device. FIG. 10 shows an arrangement comprising optical elements 3 in accordance with FIG. 1. In this example, an intermediate element 11 transparent to electromagnetic radiation is placed onto the bearing face 8 of the frame 4. A connection layer 19 may be formed between the intermediate element 11 and the bearing face 8 and/or between side faces of the intermediate element 11 and an inner wall 15 of the frame 4. The intermediate element 11 is formed as a transparent intermediate element without conversion material. The connection layer 19 may also be dispensed with.

Figure 11:
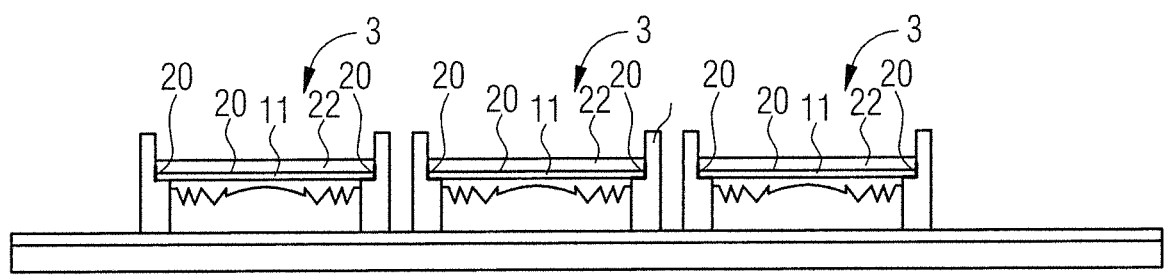

In a further method step illustrated in FIG. 11, a second intermediate element 22 is placed onto the intermediate element 11. The second intermediate element 22 may likewise mechanically connect either to the intermediate element 11 and/or to the frame 4 via a further connection layer 20. The further connection layer 20 may also be dispensed with.

Figure 12:
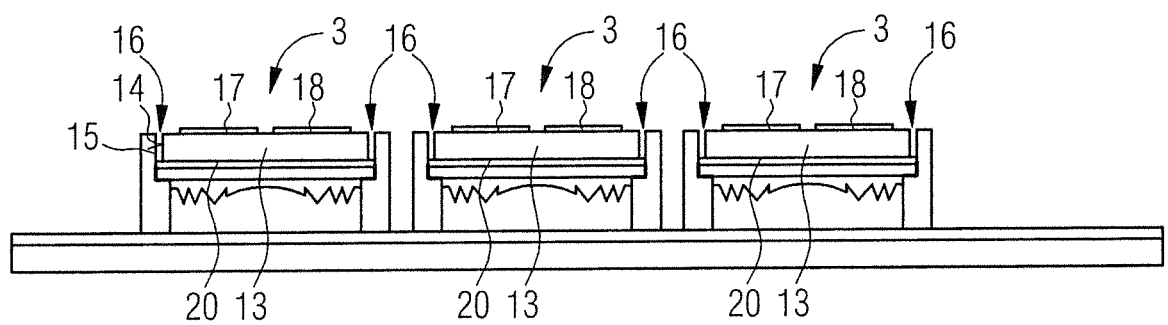

FIG. 12 shows a further method step, wherein an optoelectronic component 13 is placed onto the second intermediate element 22. The optoelectronic component 13 may connect to the second intermediate element 22 via a further connection layer 20. In this way, as early as in the method state in FIG. 12 it is possible to carry out mechanically stable securing of the optoelectronic component 13, of the second intermediate element 22 and the intermediate element 11 to the frame 4, that is to say to the optical element 3.

Figure 13:
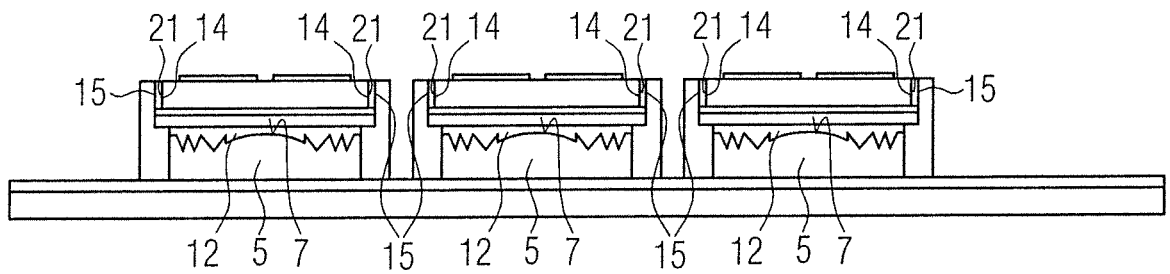

In a further method step illustrated in FIG. 13, connection material 21 may be filled into the interspace 16 between side faces 14 of the optoelectronic component 13 and an inner wall 15 of the frame 4. The connection material 21 may be formed, for example, in the form of an adhesive or a mold material. The connection material 21 may fill the entire interspace 16 or only sections or parts of the interspace 16. Secure and stable securing of the component 13 to the frame 4 is achieved with the aid of the connection material 21. Moreover, with the aid of the connection material 21, if it is filled circumferentially into the interspace 16, sealing of the free space 12 formed between the intermediate element 11 and the first side 7 of the lens 5 is also achieved. The connection material 21 may be formed as in the previous example.

Figure 14:
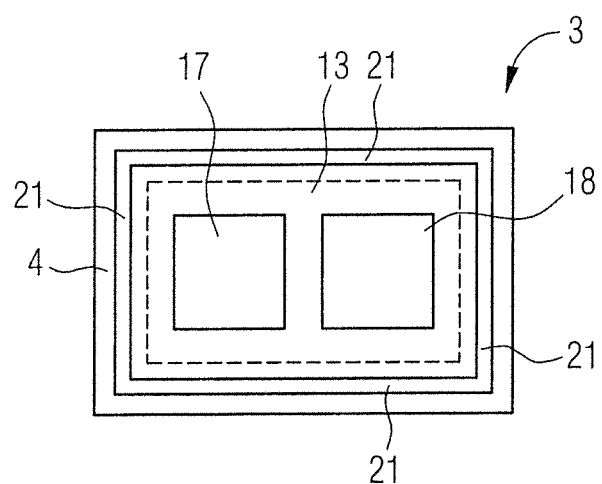
FIG. 14 shows a plan view of a device from FIG. 13.

FIG. 14 shows a plan view of an arrangement from FIG. 13. It is evident here that the connection material 21 circumferentially surrounds the component 13. However, it may be advantageous if the connection material 21 does not surround the component 13 in a closed ring to enable an exchange of air between the free space 12 and the surroundings.

If the connection material 21 in accordance with FIG. 13 is introduced between the component 13 and the frame 4, then the connection layer 19 and the further connection layers 20 may be dispensed with.

Figure 15:
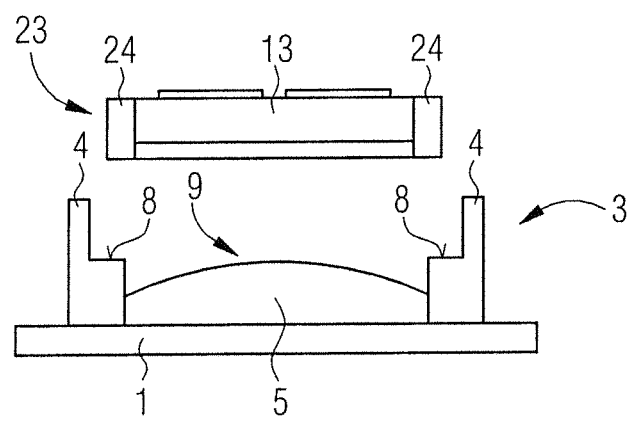
FIG. 15 shows an optical element and a unit comprising a component with a preassembled intermediate element.

FIG. 15 shows, in a schematic cross section, an optical element 3 formed in accordance with the optical elements 3 from FIG. 1 and is arranged on a carrier 1. Moreover, a unit 23 comprising an optical component 13 and an integrated intermediate element 11 is illustrated. By way of example, the intermediate element 11 may be secured to the optoelectronic component 13 via a sheath 24. The sheath 24 may be formed at side faces of the intermediate element 11 and at side faces of the component 13. The sheath 24 may consist of plastic or adhesive material or silicone. The sheath 24 may be dispensed with and the component 13 connected to the intermediate element 11 via a connection layer, in particular an adhesive layer.

Figure 16:
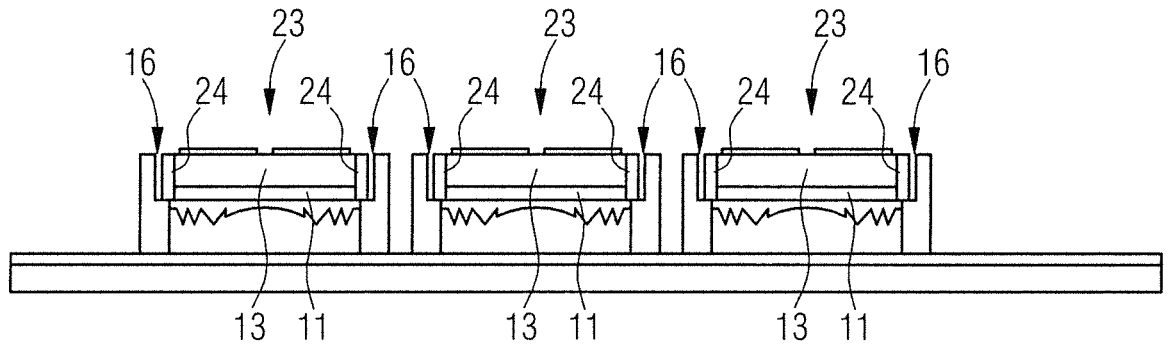
FIGS. 16 and 17 show a further method of producing a device.
Figure 17:
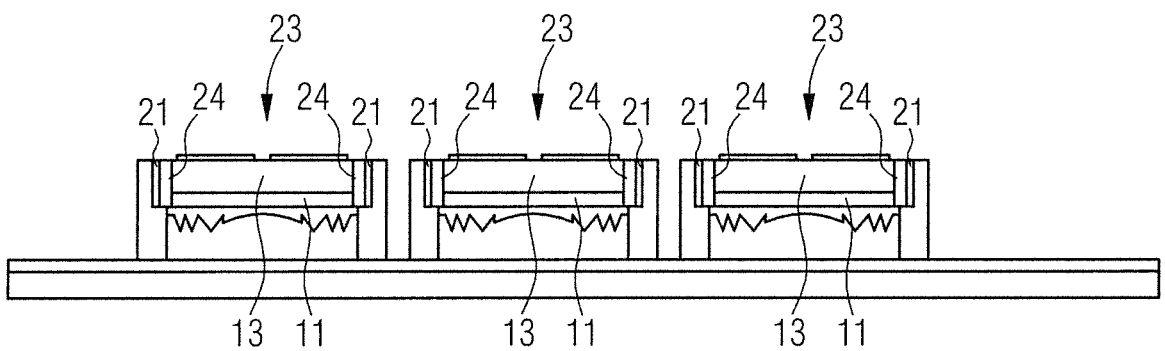

With the aid of the unit 23, a device may be produced by the method steps illustrated in FIGS. 16 and 17. The unit 23 is inserted into the receptacle space 9 of the optical element 3, as illustrated in FIG. 16. Afterward, connection material 21 is introduced into the interspace 16 between side faces of the frame 24 of the unit 23 and an inner wall 15 of the frame 4, as illustrated in FIG. 17. The connection material 21 may fill the entire interspace 16 or only sections or parts of the interspace 16. In this way, the unit 23 is secured to the frame 4 with the aid of the connection material 21. The intermediate element 11 of the unit 23 may consist, for example, of a material transparent to electromagnetic radiation, without conversion material. The intermediate element 11 may consist of plastic, glass, sapphire, ceramic or similar materials. Moreover, the unit 23 may also comprise an intermediate element 11 at least comprising conversion material or formed as a conversion element. To that end, the conversion element may be formed in the form of a mechanically stable lamina. By way of example, the conversion element may be formed in the form of a phosphor lamina. The unit 23 may be formed, for example, as a Chip Scaled Package (CSP).

The intermediate element 11 and/or the second intermediate element 22 in one or all of the examples may be formed as a diffusely scattering intermediate element.

A substrateless construction of the device may be achieved with the aid of our methods and devices. Moreover, the components used may be formed without a substrate substantially in the form of semiconductor layer structures and, e.g., only in the form of epitaxial semiconductor layers comprising electrical contacts. Furthermore, our devices are mechanically very stable despite the small dimensions. Moreover, production of the devices is simple and cost-effective. Furthermore, a simple integration of white scattering and white appearing devices may be achieved.

A frame 4 in accordance with FIG. 3 may also be used in the methods in FIGS. 4 to 17.

Figure 18:
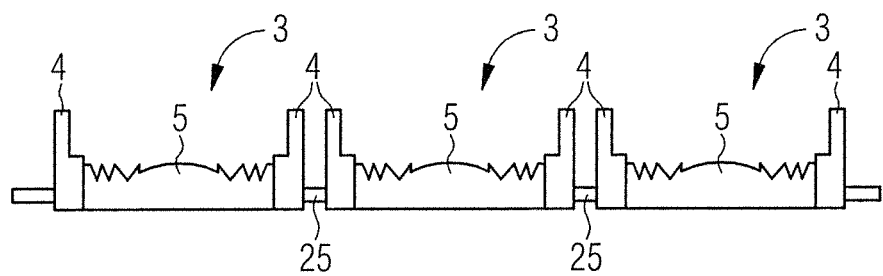
FIG. 18 shows a schematic cross section through an array of optical elements connected to one another via connection webs.

FIG. 18 shows a further example in accordance with FIG. 1, wherein the optical elements 3 are formed in accordance with FIG. 1, wherein the frames 4 of optical elements 3 arranged adjacently are connected via connection webs 25. The connection webs 25 are formed, for example, from the same material as the frames 4. Moreover, the connection webs 25 may be formed integrally and materially uniformly with the frames 4. In this way, an array of optical elements 3 comprising a defined distance from one another may be provided using simple means. The optical elements 3 may connect on four sides to a further frame of an adjacent optical element with the aid of the connection webs 25.

Figure 19:
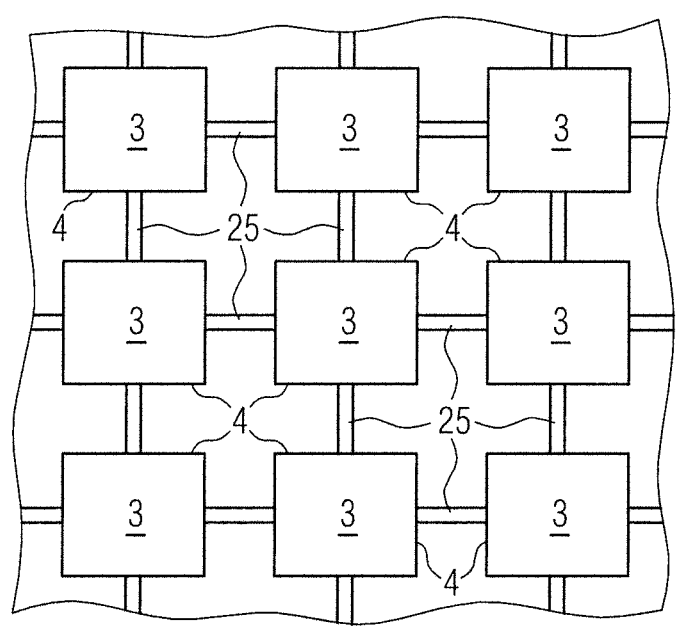
FIG. 19 shows a schematic plan view of the array of optical elements.

FIG. 19 shows a schematic excerpt from an array comprising optical elements 3, the frames 4 of which connect to one another via connection webs 25.

In an analogous manner, optical elements 3 in accordance with the example from FIG. 3 may also connect via connection webs 25 in an array. The array comprising optical elements 3 may also be used for the methods described.

Our devices and methods been illustrated and described in greater detail on the basis of preferred examples. Nevertheless, this disclosure is not restricted to the examples disclosed. Rather, other variations may be derived therefrom by those skilled in the art, without departing from the scope of protection of the appended claims.

This application claims priority of DE 10 2017 108 688.9, the subject matter of which is incorporated herein by reference.

The invention claimed is:

1. A method of producing an optoelectronic device comprising:
providing an optical element comprising an optical lens and comprising a frame, wherein the frame projects with a circular all around receptacle section beyond a first side of the lens, the receptacle section of the frame encloses a receptacle space, and the receptacle section of the frame comprises a bearing face and an inner wall at an inner side, wherein the inner wall of the receptacle section encloses the receptacle space as a circumferential annular surface;
inserting an optoelectronic component and a transparent intermediate element into the receptacle space, wherein the transparent intermediate element is a plate, the circumferential annular surface of the inner wall surrounding the optoelectronic component and the plate;

placing the transparent intermediate element with outer edge regions onto the bearing face, wherein the plate covers the receptacle space above the first side of the lens; and securing the optoelectronic component and the transparent intermediate element to the frame, wherein the transparent intermediate element is first inserted into the receptacle space and placed with the outer edge regions onto the bearing face of the frame, the optoelectronic component is inserted into the receptacle space and placed onto the transparent intermediate element, the optoelectronic component is formed as a radiation-emitting component, and the optoelectronic component is formed without a carrier in the form of semiconductor layers.

2. The method according to claim 1, wherein the transparent intermediate element is secured to the frame via a first connection layer, the optoelectronic component is secured directly to the transparent intermediate element via a second connection layer, and the second connection layer comprises transparent adhesive.

3. The method according to claim 1, wherein a circular interspace is formed between the optoelectronic component and the circumferential annular surface of the inner wall of the receptacle section of the frame, connection material is filled into the circular interspace filling up the circular interspace, wherein the connection material directly connects to side faces of the optoelectronic component and to the inner wall of the receptacle section, and the connection material connects the side faces of the optoelectronic component t5o the circumferential annular surface of the inner wall of the receptacle section of the frame.

4. The method according to claim 1, wherein the optoelectronic component is formed as semiconductor layer structures only in the form of epitaxial semiconductor layers comprising electrical contacts.

5. The method according to claim 1, wherein the bearing face of the frame is formed as a sealing surface, and the intermediate element bears with the outer edge regions on the bearing face in a sealing manner.

6. The method according to claim 1, wherein a circular interspace is formed between side faces the optoelectronic component and the circumferential annular surface of the inner wall of the receptacle section of the frame, connection material is filled into the circular interspace, wherein the connection material surrounds the component, and the connection material directly connects the side faces of the component and the circumferential annular surface of the inner wall of the receptacle section of the frame.

7. A method of producing an optoelectronic device comprising:

providing an optical element comprising an optical lens and comprising a frame, wherein the frame projects with a receptacle section beyond a first side of the lens, the receptacle section of the frame surrounds a receptacle space, the receptacle section of the frame comprises a bearing face and an inner wall at an inner side, and the inner wall of the receptacle section surrounds the receptacle space;

wherein first an intermediate element is a plate and inserted into the receptacle space and placed onto the bearing face, then, a conversion material plate is arranged on the intermediate element, then, an optoelectronic component is inserted into the receptacle space and placed onto the conversion material plate, wherein a circular interspace is formed between the optoelectronic component and the inner wall of the receptacle section of the frame, wherein connection material is filled into the circular interspace, and the connection material surrounds the optoelectronic component and connects the optoelectronic component to the inner wall of the receptacle section of the frame.

8. A method of producing an optoelectronic device comprising:

providing an optical element comprising an optical lens and comprising a frame, wherein the frame projects with a circular all around receptacle section beyond a first side of the lens, the receptacle section of the frame encloses a receptacle space, and the receptacle section of the frame comprises a bearing face and an inner wall at an inner side, wherein the inner wall of the receptacle section encloses the receptacle space as a circumferential annular surface;

inserting an optoelectronic component and a transparent intermediate element into the receptacle space, wherein the transparent intermediate element is a plate, the circumferential annular surface of the inner wall surrounding the optoelectronic component and the plate;

placing the transparent intermediate element with outer edge regions onto the bearing face, wherein the plate covers the receptacle space above the first side of the lens; and securing the optoelectronic component and the transparent intermediate element to the frame, wherein the optoelectronic component is first connected by a sheath to the transparent intermediate element to form a unit, the sheath is formed at side faces of the transparent intermediate element and at side faces of the optoelectronic component, the sheath surrounds the transparent intermediate element and the optoelectronic component, the unit comprising the optoelectronic component and the transparent intermediate element is introduced into the receptacle space and placed by the transparent intermediate element onto the bearing face, and the unit comprising the optoelectronic component and the transparent intermediate element is secured to the frame.

* * * * *